United States Patent [19]

Antypas

[11] 3,959,045

[45] May 25, 1976

[54] PROCESS FOR MAKING III-V DEVICES

[75] Inventor: George A. Antypas, Palo Alto, Calif.

[73] Assignee: Varian Associates, Palo Alto, Calif.

[22] Filed: Nov. 18, 1974

[21] Appl. No.: 524,691

[52] U.S. Cl. .................................... 156/3; 148/171; 148/175; 156/7; 156/17; 156/621; 313/103 R

[51] Int. Cl.² ........................................ H01L 21/208

[58] Field of Search .............. 148/175, 171; 156/17, 156/7, 3, 600, 621; 313/94, 103, 503; 427/74, 87; 252/792

[56] References Cited

UNITED STATES PATENTS

| | | | |
|---|---|---|---|
| 3,288,662 | 11/1966 | Weisberg | 156/17 |
| 3,721,593 | 3/1973 | Hays et al. | 148/175 |
| 3,767,494 | 10/1973 | Muroaka et al. | 156/17 |
| 3,769,536 | 10/1973 | Antypas et al. | 313/103 |

*Primary Examiner*—William A. Powell
*Assistant Examiner*—Jerome Massie
*Attorney, Agent, or Firm*—Stanley Z. Cole; David R. Pressman; Robert K. Stoddard

[57] ABSTRACT

A very thin high quality active layer of a III-V material such as GaAs is formed on a temporary substrate on which an etch-resistant stopping layer of a material such as AlGaAs has been previously formed. Passivating layers are formed on the active layer, and the active layer is interfaced with a material which forms a permanent substrate. The temporary substrate is etched away with an etchant which is stopped by the stopping layer, following which the stopping layer is removed by etching with HF. The material in the active layer acts as a chemical stop for the HF, and consequently the etching process stops automaticaly at the boundary of the active layer, leaving that layer in the thin high-quality form in which it is grown. The etching rate of the stopping layer can be controlled by the proportion of Al in that layer.

6 Claims, 7 Drawing Figures

PROCESS FOR MAKING III-V DEVICES

The invention described herein was made in the course of Contract No. DAAK02-73-C-0177 with the United States of America as represented by the Department of the Army.

BACKGROUND OF THE INVENTION

This invention pertains generally to III–V semiconductor devices and more particularly to III–V transmission photocathodes and processes for making the same.

Transmission mode GaAs photocathodes generally comprise an active GaAs layer on a transparent substrate. For maximum efficiency, the active layer should be thin (2 microns) and of high quality. In order to minimize the defect density at the interface of the active layer and substrate, the active layer and substrate should be closely matched in lattice constant. Heretofore, GaAs transmission photocathodes have been prepared by vapor phase epitaxy on transparent substrates such as $Al_2O_3$, $MgAl_2O_4$ and GaP. The lattice mismatch between the GaAs active layer and the substrates makes such devices very inefficient. It has been found that a GaAs-AlGaAs heterojunction prepared by liquid phase epitaxy is both transparent to visible radiation and has a low defect density. In the past, GaAs-AlGaAs photocathode structures have been formed on temporary substrates, and the temporary substrates have been removed by techniques such as mechanical and chemical polishing. These prior art techniques are primarily applicable to devices with small surface areas without critical surface requirements, and they generally do not produce satisfactory results in photocathodes.

Mechanical polishing is generally done with progressively smaller grits, and the smaller grits generally do not remove the initial surface scratches produced by the larger grits. The surface damage diffuses light in optical applications and inhibits epitaxial growth of additional layers. In transmission photocathode applications, surface blemishes are particularly undesirable because the irregularities can trap electrons, causing dark spots in the image, and they can also create emission points, causing light spots in the image.

In the past, there have also been some attempts to prepare the surfaces of III–V devices by etching away a portion of a layer. However, attempting to remove substantial material from a layer by etching generally results in the removal of too much material at the edges and the rounding of the surface. Moreover, accurate thickness control is difficult with etching, and attempts to etch thin layers can result in inadvertent removal of an entire layer.

SUMMARY AND OBJECTS OF THE INVENTION

The invention provides a III–V semiconductor device having a very thin, high-quality active layer of a material such as GaAs. This layer is grown epitaxially on a temporary substrate on which an etch-resistant stopping layer of a material such as AlGaAs is previously formed. Electrically and chemically passivative layers are formed on the active layer, and the active layer is interfaced with a material which forms a permanent substrate. The temporary substrate is etched away with an etchant which is stopped by the stopping layer, following which the stopping layer is removed by etching with HF. The material in the active layer acts as a chemical stop for the HF, and consequently the etching process stops automatically at the boundary of the active layer, leaving that layer in the thin, high-quality form in which it is grown. The etch rate of the stopping layer can be controlled by proportion of Al in that layer.

It is in general an object of the invention to provide a new and useful process for making III–V semiconductor devices.

Another object of the invention is to provide III–V devices having very thin (e.g. 2 microns), high-quality active layers.

Another object is to provide a process and device of the above character in which the active layer is formed by epitaxial growth on a temporary substrate and a stopping layer which are subsequently etched away.

Additional objects and features of the invention will be apparent from the following description in which the preferred embodiments are set forth in detail in conjunction with the accompanying drawings.

DESCRIPTION OF THE PREFERRED EMBODIMENTS

Figures 1A, 1B, 1C, 1D:
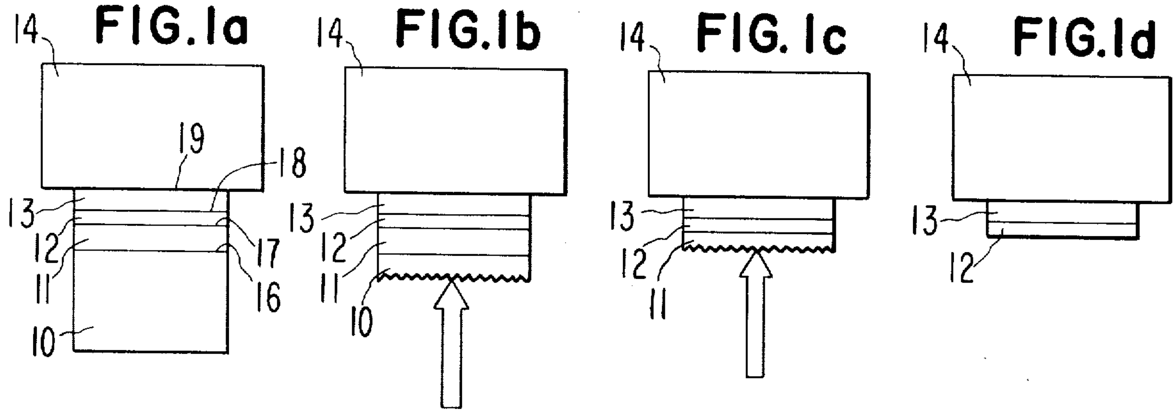
FIGS. 1*a*–1*d* are schematic diagrams illustrating the formation of a III–V device, such as a photocathode, in accordance with the invention.
Figure 2:
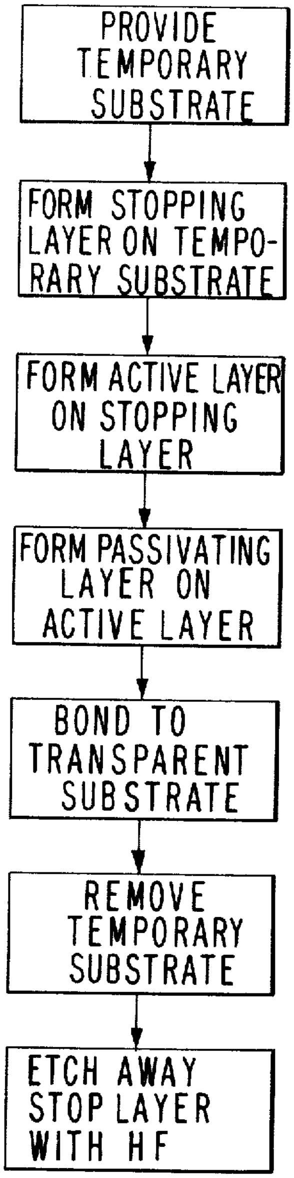
FIG. 2 is a flow chart showing the steps of the process by which the III–V device of FIGS. 1*a*–1*d* is formed.

As illustrated in FIGS. 1 and 2, a III–V device such as a photocathode is prepared according to the invention by providing a temporary substrate 10, forming a stopping layer 11 containing Al on the temporary substrate, forming an active III–V layer 12 on the stopping layer, forming an electrically passivative layer 13 on the active layer, forming a chemically passivative layer 14 on the layer 13 and bonding passivating layer 14 to a permanent substrate 15. Thereafter, the temporary substrate is removed by etching it away with an etchant which is stopped by the stopping layer, and then the stopping layer is etched away with HF at a rate determined by the proportion of Al in that layer.

Figure 3:
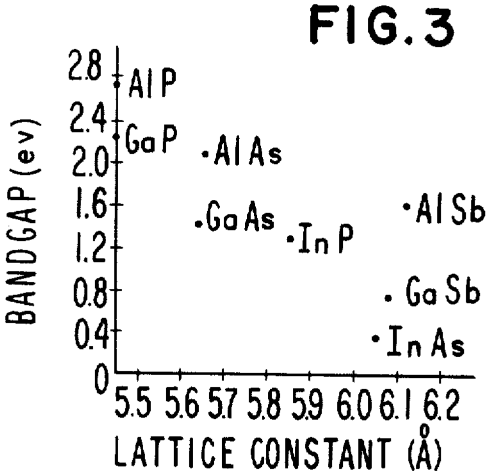
FIG. 3 is a graphical representation of the relationship between bandgap and lattice constant for a number of III–V compounds.

As discussed more fully hereinafter, the active III–V layer of a photocathode preferably has a thickness on the order of 2 microns. It has been found that high-quality layers of such thickness can be grown by liquid phase epitaxy on substrate materials which are closely matched in lattice constant to the active layer material. The actual matching requirement varies with the chemistry of the device, the growth temperature and rate, and the quality requirement, but generally lattice constant matching within about 0.1 percent will produce satisfactory results for photocathodes. In the present invention, active layer 12 must be closely matched to stopping layer 11 which in turn must be closely matched to temporary substrate 10. In the preferred embodiment, the temporary substrate and the active layer contain the same elements, and the stopping layer contains these same two elements plus aluminum. From FIG. 3, it can be seen that suitable combinations include GaAs and AlGaAs, GaP and AlGaP, and GaSb and AlGaSb. The various III–V compounds have high absorption coefficients at different wave lengths, and the compound for a particular application must be selected in accordance with the wavelength requirements. For a photocathode, GaAs is the preferred compound since it is the most sensitive to photons having wavelengths shorter than 0.9 micron.

III–V compounds of good quality are available commerically and suitable for use in temporary substrate 10. The thickness of this substrate is not critical, and a thickness on the order of 0.020 inch has been found to provide good results. Since, in the preferred embodiment, the temporary substrate is ultimately removed by etching, etching time and materials can be saved by not making the substrate too thick.

Figure 4:
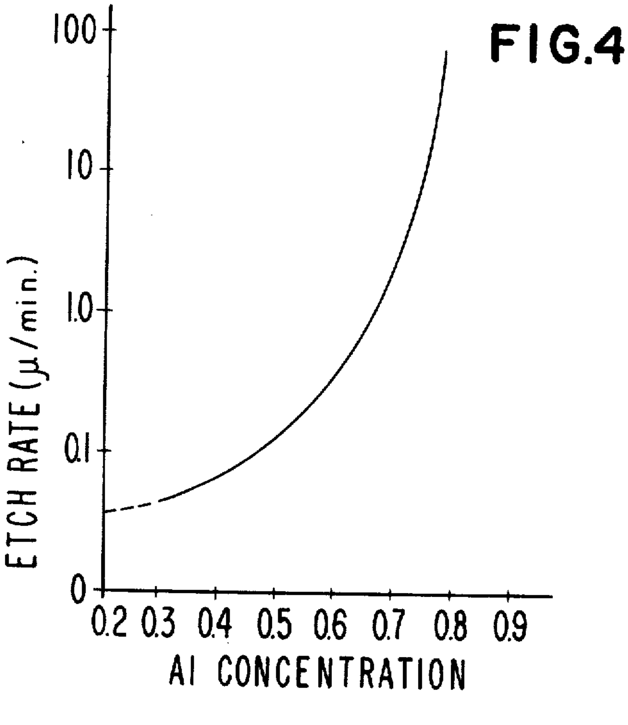
FIG. 4 is a graphical representation of the relationship between aluminum concentration and etch rate in a III–V compound.

Stopping layer 11 is grown epitaxially on the surface 16 of temporary substrate 10. As mentioned previously, this layer contains Al, and it acts as a chemical stop for the etchant used to remove the temporary substrate. The concentration of aluminum in layer 11 determines the rate at which that layer is etched away in the final step of the process. FIG. 4 illustrates the relationship between the etch rate and the aluminum concentration for $Al_xGa_{1-x}As$ etched at room temperature with an HF-water solution having an HF concentration of 0.49 where $x$ is the aluminum concentration. Since the etching rate is very low with aluminum concentrations below about 0.3, an aluminum concentration of at least 0.3 is preferred.

Since the exposed surface 17 of stopping layer 11 forms the epitaxial growing surface of active layer 12, the quality of surface 17 is reflected in the crystal quality of the active layer, particularly in the initial growth portion. A high-quality surface can be assured by making layer 11 thick enough to overcome the effects of problems such as a slight mis-match between substrate 10 and layer 11 or a substrate material of poorer quality than desired. At the same time, unduly thick layers are avoided in order to conserve time and materials in growing and etching phases of the process. A stopping layer thickness on the order of 0.5 to 5 microns has been found to give particularly satisfactory results.

As indicated above, active layer 12 is grown epitaxially on the surface 17 of stopping layer 11. The thickness of layer 12 can be precisely determined to within 0.1 micron by controlling the temperature change and the epitaxial growing time. Active layer thickness of 2 to 5 microns is preferred in photocathodes because the electron diffusion lengths fall within this range. However, high quality active layers as thin as 0.1 micron may be grown for other applications.

In addition to the binary III–V compounds heretofore mentioned, other compounds which have a lattice constant sufficiently matched with the lattice constant of layer 11 can also be used in the active layer. Such compounds include the ternaries AlGaAs, InGaAs, GaAsP, and GaAsSb. The use of three elements in the active layer permits closer lattice constant matching with the stopping layer than is possible with binary compounds. If Al is utilized in the active layer, its concentration in that layer should be substantially less than its concentration in the stopping layer to prevent inadvertent erosion of the active layer during the etching of the stopping layer.

Passivating layer 13 is grown epitaxially on the surface 18 of active layer 12. It is formed of a material such as AlGaAs which is closely matched in lattice constant to the active layer and is transparent to light energy of the desired wavelength. This layer functions as an electrical passivator and assures high quality bonding between the active layer and the permanent substrate. Suitable thicknesses for layer 13 are on the order of 2 to 5 microns.

Passivating layer 14 is formed on the surface 19 of layer 13 to prevent the diffusion of undesirable substances from substrate 15 into active layer 12 during the bonding step. In the preferred embodiment, layer 14 is formed of $SiO_2$ to a thickness on the order of 0.2 micron by RF sputtering onto surface 19. The thickness of layer 14 is not critical, but it should be at least 0.01 micron to provide adequate protection against diffusion and less than about 0.4 micron to avoid thermal expansion complications.

Permanent substrate 15 is formed of a material which is transparent to photons and which also has thermal expansive properties similar to those of active layer 12. A preferred photocathode has a GaAs active layer and a boro-silicate glass substrate. The thickness of the glass substrate is not critical and can be on the order of 0.020 to 0.250 inch. The assembly consisting of temporary substrate 10 and layers 11–14 is heat bonded to substrate 15 in the manner described in U.S. Pat. No. 3,769,536, issued Oct. 30, 1973, to the assignee herein. Briefly, the bonding process comprises placing the surface 20 of passivating layer 14 in contact with one surface of substrate 15. The temperature is raised to about the strain point of the glass substrate and maintained for about ten minutes at a pressure on the order of 10 g/cm$^2$. The time required to effect heat bonding is dependent on the strain temperature of the substrate, the temperature of the heat bonding step, and the pressure applied to urge the passivating layer against the substrate.

After the heat bonding step, temporary substrate 10 is etched away with a suitable etchant such as $NH_4OH$-$H_2O_2$. Stopping layer 11 serves as a chemical stop for this etchant and prevents etching beyond the interface of substrate 10 and layer 11.

When substrate 10 has been removed, layer 11 is etched away with HF. Active layer 12 serves as a chemical stop for the HF etchant, and the etching stops at the interface of layer 11 and layer 12. The resulting product is a III–V device consisting of active layer 12, passivating layers 13 and 14 and substrate 15, with active layer 12 having the same high quality with which it was grown.

EXAMPLE

The surface of a commercially purchased GaAs substrate having a diameter of 0.75 inch and a thickness of 0.020 inch was prepared for epitaxial growth by etching with a bromine-methyl alcohol solution containing one percent bromine at room temperature. The substrate was then placed in a graphite boat, and the boat and substrate were placed in an inert atmosphere of Pd purified $H_2$ in a crystal growing furnace with a first melt of GaAl-As having an Al to Ga weight ratio of $3\times10^{-3}$, a second melt of GaAs, and a third melt of Al-Ga-As, having an appropriate aluminum composition to produce $Al_xGa_{1-x}As$ of appropriate bandgap for the desired application, with each melt containing 5 grams of Ga. The temperature of the system was brought up to 900°C. The substrate was brought into contact with the first melt and maintained there until the system cooled to 895°C, forming an $Al_{0.5}Ga_{0.5}As$ stopping layer having a thickness of 4 microns. The stopping layer was brought into contact with the GaAs melt and maintained there while the system cooled to 893°C, forming an active GaAs layer having a thickness of 2 microns. The active layer was then contacted with the third melt and maintained there while the system cooled to 883°C, forming an AlGaAs passivating layer having a thickness of 5 microns. The substrate and layers grown thereon were removed from the furnace, and a 0.2 micron layer of $SiO_2$ was formed on the surface of the AlGaAs passivating layer by RF sputtering. The substrate and layers were then heat bonded to a glass substrate having a thickness on the order of 0.050 inch and an expansion coefficient closely matching that of GaAs. The heat bonding was carried out at a temperature on the order of 680°C, a pressure on the order of about 10 $g/cm^2$ and for a time on the order of 10 minutes. The bonded assembly was cooled to room temperature, and the GaAs substrate was etched away with $NH_4OH$-$H_2O_2$, and the AlGaAs stopping layer was etched away with HF having a concentration of 0.49. The GaAs active layer of the resulting device had a surface uniformity on the order of 0.1 micron.

It is apparent from the foregoing that a new and improved III–V device and process for making such devices have been provided. While only the preferred embodiments have been described, as will be apparent to those familiar with the art, certain changes and modifications can be made without departing from the scope of the invention as defined by the following claims.

I claim:

1. In a process for making a photocathode device for providing free electrons in response to incident photons, the steps of: providing a temporary substrate of GaAs, forming a stopping layer of AlGaAs on the temporary substrate, forming on the stopping layer an active layer of GaAs for delivering free electrons in response to photons incident thereon, forming a passivating layer of AlGaAs on the active layer, bonding the temporary substrate and the layers to a photon transparent substrate with the passivating layer closest to the transparent substrate, removing the temporary substrate, and effecting removal of the stopping layer by etching with HF.

2. The process of claim 1 wherein the layers are formed by liquid phase epitaxial growth.

3. The process of claim 1 further including the step of forming an additional passivating layer of $SiO_2$ on the first named passivating layer before bonding to the transparent substrate.

4. The process of claim 1 wherein the temporary substrate is removed by etching.

5. The process of claim 1 wherein the composition of the stopping layer is $Al_xGa_{1-x}As$, where x is greater than 0.3.

6. The process of claim 1 wherein the active layer also contains an element from the group consisting of Al, In and Sb, said element being present in a concentration such that said active layer is less soluble in HF than is said stopping layer.

* * * * *